United States Patent
Son et al.

(10) Patent No.: US 9,196,872 B2
(45) Date of Patent: Nov. 24, 2015

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Jung-Hyun Son, Yongin (KR); Kie-Hyun Nam, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/873,645

(22) Filed: Apr. 30, 2013

(65) Prior Publication Data

US 2014/0191203 A1  Jul. 10, 2014

(30) Foreign Application Priority Data

Jan. 10, 2013 (KR) .................. 10-2013-0003141

(51) Int. Cl.
*H01L 51/00* (2006.01)
*H01L 51/52* (2006.01)
*H01L 27/32* (2006.01)

(52) U.S. Cl.
CPC ........ *H01L 51/5284* (2013.01); *H01L 27/3246* (2013.01); *H01L 51/525* (2013.01); *H01L 51/0024* (2013.01)

(58) Field of Classification Search
CPC .... H01L 51/5284; H01L 51/56; H01L 27/322

USPC .............................. 257/40, 59, 72; 438/28, 99
See application file for complete search history.

(56) References Cited

U.S. PATENT DOCUMENTS

| 7,811,679 B2 * | 10/2010 | Aziz et al. ............... 428/690 |
| 8,258,696 B2 | 9/2012 | Oh et al. |
| 2001/0043046 A1 * | 11/2001 | Fukunaga ............... 315/160 |
| 2002/0008689 A1 * | 1/2002 | Koyama et al. ............ 345/100 |
| 2005/0046340 A1 * | 3/2005 | Kohara et al. ............. 313/504 |
| 2006/0220549 A1 * | 10/2006 | Kim et al. ............... 313/512 |
| 2007/0200492 A1 * | 8/2007 | Cok et al. ............... 313/506 |
| 2011/0157135 A1 | 6/2011 | Lee et al. |
| 2011/0163340 A1 | 7/2011 | Smith |
| 2011/0210348 A1 * | 9/2011 | Yuasa ..................... 257/88 |

FOREIGN PATENT DOCUMENTS

| KR | 10-2010-0047367 A | 5/2010 |
| KR | 10-2011-0036011 A | 4/2011 |
| KR | 10-2011-0078787 A | 7/2011 |

* cited by examiner

*Primary Examiner* — Tu-Tu Ho
(74) *Attorney, Agent, or Firm* — Robert E. Bushnell, Esq.

(57) ABSTRACT

Provided is an organic light-emitting display apparatus that includes a display substrate; a plurality of organic light-emitting devices (OLEDs) that are disposed on the display substrate and are separated by a pixel defining layer; an encapsulation substrate that is disposed facing the display substrate and covers the OLEDs; and a filling material that is disposed between the display substrate and the encapsulation substrate and disposed corresponding to the pixel defining layer, wherein the filling material includes a material that absorbs visible light and a method manufacturing the organic light-emitting display apparatus.

23 Claims, 5 Drawing Sheets

ORGANIC LIGHT-EMITTING DISPLAY
APPARATUS AND METHOD OF
MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY APPARATUS AND METHOD OF MANUFACTURING THE SAME, earlier filed in the Korean Intellectual Property Office on Jan. 10, 2013 and there duly assigned Serial No. 10-2013-0003141.

BACKGROUND OF THE INVENTION

1. Field of the Invention

The present invention relates to an organic light-emitting display apparatus and a method of manufacturing the organic light-emitting display apparatus, and more particularly, to an organic light-emitting display apparatus that includes a filling material and a method of manufacturing the same.

2. Description of the Related Art

An organic light-emitting display apparatus includes a hole injection electrode, an electron injection electrode, and an organic light-emitting device that is formed between the hole injection electrode and the electron injection electrode and includes an organic light-emitting layer. The organic light-emitting display apparatus is an emissive type light-emitting display apparatus that generates light when an energy state of excitons falls from an excited state to a ground state, wherein the excitons are generated by combining holes injected from the hole injection electrode and electrons injected from the electron injection electrode.

An organic light-emitting display apparatus that is an emissive type display apparatus, and thus, an additional light source is not required. Also, the organic light-emitting display apparatus can be driven at a low voltage, can be formed in a light weight and thin film type, and has characteristics of large viewing angle, high contrast, and short response time, and thus, is expected to be a next generation display apparatus.

SUMMARY OF THE INVENTION

The present invention provides an organic light-emitting display apparatus that employs a patterned filling material, and a method of manufacturing the same, and more particularly, to an organic light-emitting display apparatus that can reduce optical loss, can increase contrast, and can strengthen structure, and a method of manufacturing the same.

According to an aspect of the present invention, there is provided an organic light-emitting display apparatus including: a display substrate; a plurality of organic light-emitting devices (OLEDs) that are disposed on the display substrate and are separated by a pixel defining layer; an encapsulation substrate that is disposed facing the display substrate and covers the OLEDs; and a filling material that is disposed between the display substrate and the encapsulation substrate and disposed corresponding to the pixel defining layer, wherein the filling material includes a material that absorbs visible light.

In some embodiment of the present invention, the filling material may include at least one of a black pigment, a black dye, and black particles.

In some embodiment of the present invention, the filling material may include at least one of methyl silicone and phenyl silicone.

In some embodiment of the present invention, the filling material may include at least one selected from the group consisting of Cr, CrO, Graphite, and C.

In some embodiment of the present invention, the organic light-emitting display apparatus may further include a color filter disposed corresponding to the OLED on the encapsulation substrate.

In some embodiment of the present invention, the organic light-emitting display apparatus may further include cavities that are disposed between the display substrate and the encapsulation substrate and may be disposed corresponding to the OLED, wherein the cavities are filled with air or $N_2$ gas.

In some embodiment of the present invention, the organic light-emitting display apparatus may further include a protective layer disposed on the OLEDs.

In some embodiment of the present invention, the organic light-emitting display apparatus may further include a polarizing layer disposed on the encapsulation substrate.

In some embodiment of the present invention, the organic light-emitting display apparatus may further include an encapsulating member that combines the display substrate with the encapsulation substrate and may be disposed to surround the OLEDs.

In some embodiment of the present invention, the organic light-emitting display apparatus may further include a moisture absorbent disposed on a side of the OLEDs.

According to another aspect of the present invention, there is provided an organic light-emitting display apparatus including: a display substrate; a display unit that is formed on the display substrate and includes a plurality of light-emitting regions on which OLEDs are disposed and non-light-emitting regions that separate the light-emitting regions; an encapsulation substrate that is disposed facing the display substrate; and a filling material that is disposed between the display substrate and the encapsulation substrate and is disposed corresponding to the non-light-emitting regions, wherein the filling material performs as a black matrix that absorbs visible light.

In some embodiment of the present invention, the non-light-emitting regions may protrude more than the light-emitting regions.

In some embodiment of the present invention, the filling material may not be formed on the light-emitting regions.

In some embodiment of the present invention, the filling material may be formed of an insulating material that includes a black pigment, a black dye, or black particles.

In some embodiment of the present invention, the organic light-emitting display apparatus may further include a color filter disposed corresponding to the OLEDs on the encapsulation substrate.

In some embodiment of the present invention, the organic light-emitting display apparatus may further include a protective layer on the OLEDs.

According to an aspect of the present invention, there is provided a method of manufacturing an organic light-emitting display apparatus, the method including: forming a patterned filling material on a surface of an encapsulation substrate; forming a display unit on a surface of a display substrate; and combining the display substrate with the encapsulation substrate with an encapsulating member by disposing the display substrate and the encapsulation substrate so that the display substrate faces the filling material, wherein the filling material comprises at least one of a black pigment, a black dye, and black particles.

In some embodiment of the present invention, the display unit may be divided into light-emitting regions on which OLEDs are disposed and non-light-emitting regions that separate the light-emitting regions, and the filling material may be patterned to be disposed only on regions of the display unit corresponding to the non-light-emitting regions.

In some embodiment of the present invention, the filling material may include at least one of methyl silicone and phenyl silicone.

In some embodiment of the present invention, the filling material may include at least one selected from the group consisting of Cr, CrO, Graphite, and C.

In some embodiment of the present invention, the forming of the patterned filling material may include: distributing at least one of a black pigment, a black dye, and black particles in a liquid phase filling material; coating the liquid phase filling material on the encapsulation substrate; and patterning the filling material through an exposure and developing process.

In some embodiment of the present invention, the method may further include hardening the liquid phase filling material.

In some embodiment of the present invention, the combining of the display substrate with the encapsulation substrate may further include: coating the encapsulating member to surround edges of the filling material; and combining the display substrate with the encapsulation substrate by using the encapsulating member in a vacuum state by disposing the display substrate and the encapsulation substrate so that the display substrate faces the filling material.

In some embodiment of the present invention, the display unit may be divided into light-emitting regions on which OLEDs are disposed and non-light-emitting regions that separate the light-emitting regions, and the method may further include forming a color filter in regions of the encapsulation substrate that corresponds to the light-emitting regions.

In some embodiment of the present invention, the method may further include forming a moisture absorbent between the encapsulation member and the filling material before combining the display substrate with the encapsulation substrate.

The organic light-emitting display apparatus according to the present invention includes the filling material that performs as a black matrix, and thus, the structural strength of the organic light-emitting display apparatus may be increased and, at the same time, color definition and contrast are increased.

Also, the filling material is formed on the non-light-emitting regions of the organic light-emitting display apparatus, and thus, the structural strength of the organic light-emitting display apparatus may be increased and, at the same time, the loss of light emitted from the light-emitting regions due to the filling material may be prevented since the filling material is not formed on the light-emitting regions.

Since the filling material is not formed in the light-emitting regions of the organic light-emitting display apparatus, the occurrence of dark spots due to the filling material may be prevented.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereafter, the present invention will be described more fully with reference to the accompanying drawings of FIGS. 1 to 7. In the drawings, like reference numerals denote like elements and thus, the descriptions thereof will not be repeated. Also, in the drawings, lengths and sizes of layers and regions may be exaggerated for clarity.

The invention described below is exemplary, and thus, may be embodied in many different forms. For example, when an element or layer is referred to as being "on" another element or layer, the element or layer may be directly on another element or layer or intervening elements or layers.

The terminologies used herein are for the purpose of describing particular embodiments only and is not intended to be limiting of the inventive concept. As used herein, the singular forms are intended to include the plural forms as well, unless the context clearly indicates otherwise. It will be further understood that the terms: comprise" and/or "comprising," when used in this specification, specify the presence of stated features, steps, operations, and/or components, but do not preclude the presence or addition of one or more other features, steps, operations, and/or components, and/or groups thereof. It will be understood that, although the terms first, second, third, etc., may be used herein to describe various elements, these elements should not be limited by these terms, and the terms are used for the purpose of distinguishing an element from another element.

It should be understood that when an embodiment is able to be embodied in a different form, the sequence of a specific process may be performed in a sequence different from the sequence described. For example, two processes consecutively described may be simultaneously performed, or may be performed in a reversed sequence.

Figure 1A:
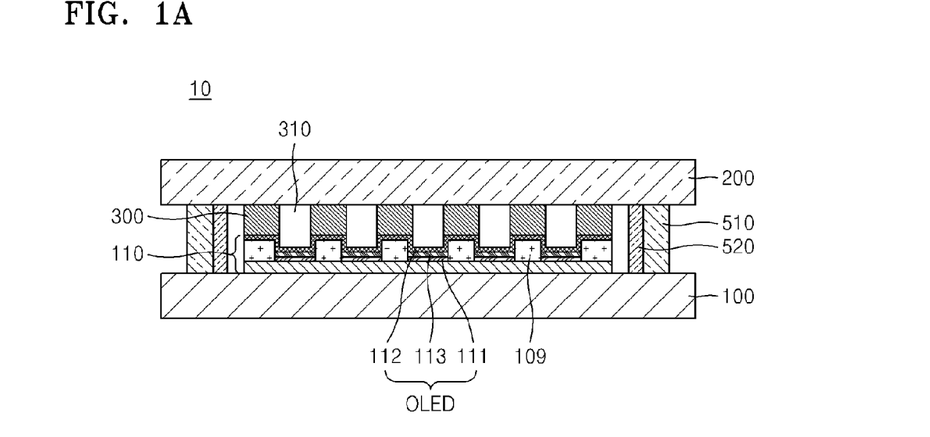
FIG. 1A is a schematic cross-sectional view of an organic light-emitting display apparatus according to an embodiment of the present invention.
Figure 1B:
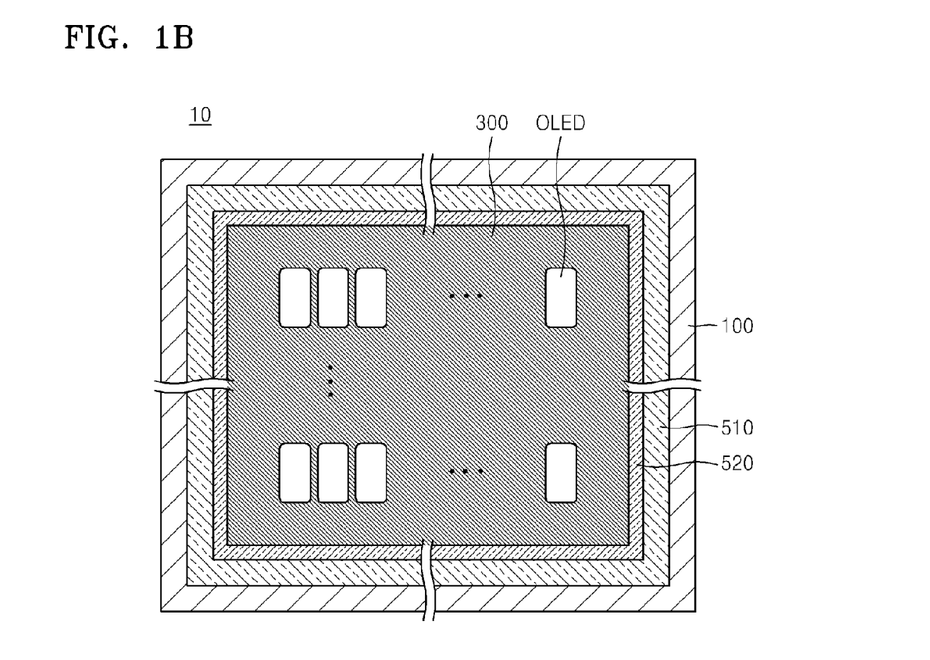
FIG. 1B is a schematic plan view of the organic light-emitting display apparatus of FIG. 1A.
Figure 2:
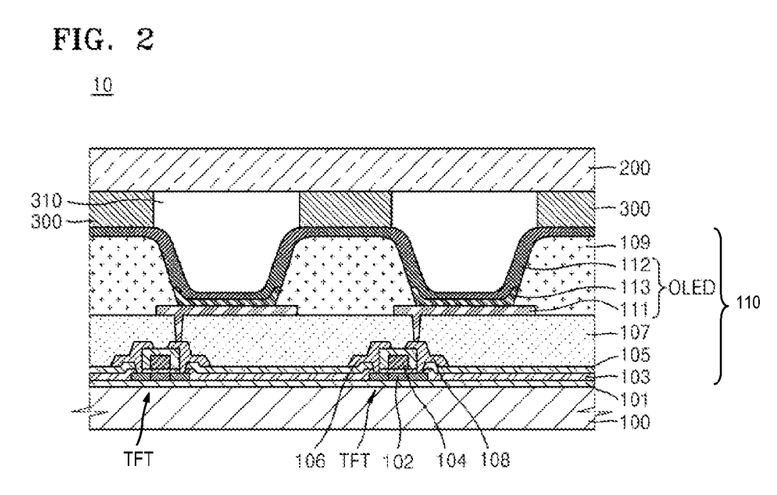
FIG. 2 is a schematic cross-sectional view showing a portion of the organic light-emitting display apparatus of FIG. 1A.

FIG. 1A is a schematic cross-sectional view of an organic light-emitting display apparatus 10 according to an embodiment of the present invention. FIG. 1B is a schematic plan view of the organic light-emitting display apparatus 10 of FIG. 1A. FIG. 2 is a schematic cross-sectional view showing a portion of the organic light-emitting display apparatus 10 of FIG. 1A.

Referring to FIGS. 1A, and 1B, and FIG. 2, the organic light-emitting display apparatus 10 may includes a display substrate 100, a display unit 110, an encapsulation substrate 200, and a filling material 300. Also, the organic light-emitting display apparatus 10 may further include at least one of an encapsulating member 510 or a moisture absorbent 520.

The display substrate 100 may be formed of a transparent glass material having $SiO_2$ as a main component. The display substrate 100 according to the present invention is not limited thereto, that is, may be formed of a transparent plastic material. The plastic material to be used for forming the display substrate 100 may be an insulating organic material selected from the group consisting of polyethersulphone (PES), polyacrylate (PAR), polyetherimide (PEI), polyethyelenennapthalate (PEN), polyethyeleneterepthalate (PET), polyphenylenesulfide (PPS), polyallylate, polyimide, polycarbonate (PC), cellulotriacetate (TAC), and celluloseacetatepropionate (CAP).

In the case of a bottom emission type organic light-emitting display apparatus in which an image is realized in a direction towards the display substrate 100, the display substrate 100 may be formed of a transparent material. However, in the case of a top emission type organic light-emitting display apparatus in which an image is realized in a direction opposite to the display substrate 100, the display substrate 100 may not be necessarily formed of a transparent material and may be formed of ceramic or a metal material. For example, the display substrate 100 may include at least one material selected from the group consisting of carbon, iron, chrome, manganese, nickel, titanium, molybdenum, and stainless steel (SUS), but not limited thereto. The display substrate 100 may use a substrate formed of a metal foil.

An auxiliary layer 101 (not shown in Figures) such as a bearing layer, a blocking layer, and/or a buffer layer for preventing diffusion of impurity ions, preventing penetration of moisture or external air, and for planarizing a surface may be formed on an upper surface of the display substrate 100. The auxiliary layer 101 may be formed of $SiO_2$ and/or $SiN_x$ and/or $SiO_xN_y$. The auxiliary layer 101 may be formed by using various deposition methods, such as a plasma enhanced chemical vapor deposition (PECVD) method, an atmospheric pressure CVD (APCVD) method, or a low pressure CVD (LPCVD) method. The auxiliary layer 101 is not a requisite layer, and accordingly, may be omitted if unnecessary.

The display unit 110 may be disposed on an upper surface of the display substrate 100 and may include thin film transistors (TFTs) and organic light-emitting devices (OLEDs). In FIG. 2, a TFT is formed on each of pixels for convenience of explanation. However, the present invention is not limited thereto, that is, a plurality of TFTs and storage capacitors may further be included in each of the pixels.

The TFTs drive the OLEDs by being electrically connected to the OLEDs. The TFTs depicted in FIG. 2 are top gate type TFTs and the top gate type TFT may includes an active layer 102, a gate electrode 104, a source electrode 106, and a drain electrode 108 in the stated order from the display substrate 100. In FIG. 2, top gate type TFTs are depicted. However, the present invention is not limited to the top gate type TFTs, and thus, it should be understood by those ordinary skilled in the art that the present invention may employ various types of TFTs.

The active layer 102 may be formed by patterning an inorganic semiconductor layer, such as silicon or an oxide semiconductor, or an organic semiconductor layer after forming the inorganic semiconductor layer or an organic semiconductor layer on a whole surface of the auxiliary layer 101 or on the display substrate 100.

In another embodiment, the active layer 102 may be formed of amorphous silicon. In this case, after forming amorphous silicon on a whole surface of the display substrate 100, a polycrystalline silicon layer may be formed by crystallizing the amorphous silicon and the polycrystalline silicon layer is patterned. Afterwards, a source region and a drain region may be formed on edge regions of the active layer 102 by doping a dopant in the source region and the drain region, and the active layer 102 that includes a channel region may be formed between the source region and the drain region.

In another embodiment, the active layer 102 may be formed of an oxide semiconductor. For example, the oxide semiconductor may include an oxide selected from the group consisting of a metal element of group 12, 13, and 14, such as Zn, In, Ga, Sn, Cd, Ge, Hf, and combinations of these materials.

The source region and the drain region may be formed on edge regions of the active layer 102, and the source region and the drain region may be respectively connected to a source electrode 106 and a drain electrode 108. A gate insulating layer 103 may be formed on the active layer 102, and a gate electrode 104 may be formed on a predetermined region of an upper surface of the gate insulating layer 103. The gate electrode 104 may be connected to a gate line (not shown) that applies an ON/OFF signal to the TFT.

An interlayer insulating layer 105 is formed on the gate electrode 104, and the source electrode 106 and the drain electrode 108 are respectively formed to be connected to the source region and the drain region of the active layer 102.

The gate insulating layer 103 and the interlayer insulating layer 105 may be formed of an insulating material. For example, the gate insulating layer 103 and the interlayer insulating layer 105 may be formed to be a single-layered or a multi-layered structure of an inorganic material, an organic material, or a composite of an organic material and an inorganic material. In the current embodiment, the gate insulating layer 103 and the interlayer insulating layer 105 may be formed by including $SiN_x$ or $SiO_2$.

A planarizing layer 107 may protect the TFT by covering the TFT and/or may planarize an upper surface of the TFT by removing a step difference of the TFT in order to increase light-emitting efficiency of an organic light-emitting device to be formed on the planarizing layer 107. The planarizing layer 107 may be formed of an inorganic insulating layer and/or an organic insulating layer. The inorganic insulating layer may be formed including at least one of $SiO_2$, SiNx, SiON, $Al_2O_3$, $TiO_2$, $Ta_2O_5$, $HfO_2$, $ZrO_2$, BST, and PZT, and the organic insulating layer may be formed including at least one material selected from the group consisting of poly(methylmethacrylate) (PMMA), polystyrene (PS), a polymer derivative having a phenol group, an acryl group polymer, an imide group polymer, an arylester group polymer, an amide group polymer, a fluoride group polymer, a p-gilyrene group polymer, a vinyl alcohol group polymer, and a blend of these materials. Also, the planarizing layer 107 may be formed of a composite stack layer of the inorganic insulating layer and the organic insulating layer.

The OLEDs are formed in the light-emitting regions of an upper surface of the planarizing layer 107. The light-emitting regions and the non-light-emitting regions will be described below when a pixel defining layer 109 is described.

Each of the OLEDs includes an anode electrode 111 connected to one of the source electrode 106 and the drain electrode 108 of the TFT, a cathode electrode 112 formed facing the anode electrode 111, and an organic light-emitting layer 113 interposed between the anode electrode 111 and the cathode electrode 112.

The anode electrode 111 of the OLED is formed on the planarizing layer 107, and the pixel defining layer 109 covering the anode electrode 111 is formed by using an insulating material. The pixel defining layer 109 may be formed by including a resin, such as polyacrylates, polyimides, benzo-cyclobutene, or phenol and an inorganic material of a silica group. In the current embodiment, the pixel defining layer 109 may be formed by using a spin coating method.

After forming a predetermined opening that exposes a central region of the anode electrode 111 in the pixel defining layer 109, the organic light-emitting layer 113 of the OLED may be formed in a region defined as the opening. Afterwards, the cathode electrode 112 of the OLED is formed to cover the entire pixel defining layer 109 and the organic light-emitting layer 113.

A sub-pixel may be defined by the opening of the pixel defining layer 109, and one OLED is disposed in each of the sub-pixels. That is, light-emitting regions are formed in the opening of the pixel defining layer 109 due to the formation of the organic light-emitting layer 113, and the light-emitting regions are separated by the pixel defining layer 109. Also, the pixel defining layer 109 may be defined as non-light-emitting regions.

The anode electrode 111 may be a transparent electrode or a reflective electrode. When the anode electrode 111 is a transparent electrode, the anode electrode 111 may be formed of a material selected from the group consisting of ITO, IZO, ZnO, and $In_2O_3$, and when the anode electrode 111 is a reflective electrode, the anode electrode 111 may include a reflective film formed of a material selected from the group consisting of Ag, Mg, Al, Pt, Pd, Au, Ni, Nd, Ir, Cr, and a compound of these materials and a transparent film formed of a material selected from the group consisting of ITO, IZO, ZnO, and $In_2O_3$. In the current embodiment, the anode electrode 111 may be a reflective electrode having an ITO/Ag/ITO structure.

The cathode electrode 112 may also be a transparent electrode or a reflective electrode. When the cathode electrode 112 is a transparent electrode, the cathode electrode 112 may include a layer formed to face the organic light-emitting layer 113 by depositing a material selected from the group consisting of Li, Ca, LiF/Ca, LiF/Al, Al, Mg, and a compound of these materials and an auxiliary electrode or a bus electrode line formed of a transparent conductive material selected from the group consisting of TO, IZO, ZnO, and $In_2O_3$ on the layer. When the cathode electrode 112 is a reflective electrode, the cathode electrode 112 may be formed of a material selected from the group consisting of Li, Ca, LiF/Ca, LiF/Al, Al, Mg, and a compound of these materials. In the current embodiment, the anode electrode 111 and the cathode electrode 112 may be reversed.

The organic light-emitting layer 113 included between the anode electrode 111 and the cathode electrode 112 may be formed of a low molecular weight organic material or a polymer organic material. When the organic light-emitting layer 113 is formed of a low molecular weight organic material, a hole injection Layer (HIL) (not shown), a hole transport layer (HTL) (not shown), an electron transport layer (ETL) (not shown), or an electron injection layer (EIL) (not shown) may be stacked in a single or composite stack structure by disposing the organic light-emitting layer 113 therebetween. The organic light-emitting layer 113 may be formed of various materials including copper phthalocyanine (CuPc), N,N'-di (naphthalene-1-yl)-N,N'-diphenyl-benzidine (NPB), or tris-8-hydroxyquinoline aluminium (Alq3). The low molecule organic material may be formed by using a vacuum evaporation method.

When the organic light-emitting layer 113 is formed of a polymer organic material, a structure in which a hole transport layer (HIL) (not shown) is further formed towards the anode electrode 111 from the organic light-emitting layer 113 may be formed. At this point, the HTL may be formed of poly-(2,4)-ethylene-dihydroxy thiophene (PEDOT), and the organic light-emitting layer 113 may be formed of a polymer organic material, such as a poly-phenylenevinylene (PPV) group material or a polyfluorene group material. The organic light-emitting layer 113 formed in this way may emit one of red, green, and blue light.

Also, in FIG. 2, the organic light-emitting layer 113 is disposed only in the opening of the pixel defining layer 109. However, the present disclosure is not limited thereto. For example, the organic light-emitting layer 113 may be formed on the anode electrode 111 in the opening of the pixel defining layer 109 and may also be disposed between the pixel defining layer 109 and the cathode electrode 112.

In the embodiment described above, different light-emitting materials are formed in each of the sub-pixels by forming the organic light-emitting layers 113 in the openings, but the present disclosure is not limited thereto. That is, the organic light-emitting layer 113 may be commonly formed on the whole planarizing layer 107 regardless of the locations of the sub-pixels. At this point, the organic light-emitting layer 113 may be formed by vertically stacking or mixing layers that include light-emitting materials that emit, for example, red, green, or blue light. Of course, if the organic light-emitting layer 113 may emit white light, the organic light-emitting layer 113 may also emit a combination of different colors.

The display unit 110 that is used in the current embodiment includes the TFTs and the OLEDs formed on the display substrate 100. Accordingly, the display unit 110 includes a plurality of light-emitting regions in which the OLEDs are disposed and the non-light-emitting regions which are protruded pixel defining layers 109 that separate the plural light-emitting regions.

The encapsulation substrate 200 is disposed facing the display substrate 100. The encapsulation substrate 200 blocks the display unit 110 that includes the OLEDs from external moisture and air. The encapsulation substrate 200 may use not only a glass material display substrate 100 but also various plastic material substrates, and furthermore, may use a metal plate. In the current embodiment, a polarizing layer or a color conversion layer may further be formed on the encapsulation substrate 200.

The filling material 300 is disposed between the display substrate 100 and the encapsulation substrate 200, and is disposed corresponding to the pixel defining layer 109 on the pixel defining layer 109. That is, the filling material 300 is disposed corresponding to the non-light-emitting regions on the pixel defining layer 109. The filling material 300 may not be disposed on the light-emitting regions that are defined by the OLEDs. However, the present disclosure is not limited thereto, that is, the filling material 300 may be disposed on the OLEDs. In the current embodiment, the filling material 300 is patterned to be remained on the non-light-emitting regions. Referring to FIG. 1A, the filling material 300 may be patterned in a mesh shape to the encapsulation substrate 200 to surround the light-emitting regions.

The filling material 300 protects the display unit 110 from impact that may be applied from the outside. Also, the filling material 300 may absorb visible light incident from the outside, may prevent a color mix or interference of visible light emitting through the OLEDs, and may increase contrast of the organic light-emitting display apparatus 10. That is, the filling material 300 performs as a black matrix.

The filling material 300 may be formed of an insulating material. In the current embodiment, the filling material 300 may include at least one of methyl silicone and phenyl silicone. In the current embodiment, the filling material 300 may be polyimide. However the present disclosure is not limited thereto, that is, the filling material 300 may be formed of a material selected from the group consisting of a urethane group resin which is an organic sealant, an epoxy group resin, an acryl group resin, and silicon which is an inorganic sealant.

When the filling material 300 is formed of thermally stable silicon, the filling material 300 may not be degraded by heat generated during an operation of the organic light-emitting display apparatus 10. Also, the filling material 300 may not be degraded by heat when the display substrate 100 and the encapsulation substrate 200 are combined by using heat.

The filling material 300 may include a material that absorbs visible light. The filling material 300 may include at least one of a black dye, a black pigment, and black particles. In the current embodiment, the filling material 300 may include Cr or CrOx, Cr/CrOx, Cr/CrOx/CrNy, a resin (carbon pigment or RGB mixed pigment), graphite, or non-Cr group material.

Cavities 310 are disposed corresponding to the OLEDs above the OLEDs. In the current embodiment, the cavities 310 may be filled with air or an $N_2$ gas, or may be a vacuum state.

The encapsulating member 510 is disposed to surround the display unit 110, and may combine the display substrate 100 with the encapsulation substrate 200. The encapsulating member 510 blocks the display unit 110 that includes the OLEDs from external moisture and air. The encapsulating member 510 may be formed of a conventional material such as sealing glass or frit.

The moisture absorbent 520 may be disposed on a side of the display unit 110. The moisture absorbent 520 may prevent the OLEDs from reducing lifetime due to moisture or oxygen by readily reacting with the moisture or oxygen. The moisture absorbent 520 may be formed of a material selected from the group consisting of alkaline metal oxide, alkaline earth metal oxide, metal halide, lithium sulfate, metal sulfate, metal perchlorate, silica gel, phosphorus pentoxide, and a mixture of these materials. The type and disposition of the moisture absorbent 520 according to the present disclosure are not limited to the above descriptions.

Although not shown, the organic light-emitting display apparatus 10 may further include a conductive layer (not shown) between the non-light-emitting regions and the filling material 300. The conductive layer may reduce a resistance and prevent a voltage drop of the cathode electrode 112 by being electrically connected to the cathode electrode 112 of the OLED. The conductive layer may be formed of a material selected from the group consisting of Li, Ca, LiF/Ca, LiF/Al, Al, Mg, and Ag. Besides above, a protective layer for protecting the OLEDs may further be included in the organic light-emitting display apparatus 10.

As described above, the organic light-emitting display apparatus 10 according to the current embodiment includes a filling material 300 that performs as a black matrix, and thus, the structural strength of the organic light-emitting display apparatus 10 is increased and, at the same time, color definition and contrast are increased.

In the organic light-emitting display apparatus 10 according to the current embodiment, the filling material 300 may not be disposed on the OLEDs which are light emitting regions or a small amount is disposed on the OLEDs. Therefore, optical loss due to the disposition of the filling material 300 may be prevented and the occurrence of dark spots due to the presence of the filling material 300 may be reduced.

Also, in the light-emitting region of the organic light-emitting display apparatus 10, the cavities 310 are formed on the OLEDs, and thus, damage to the OLEDs due to particles may be prevented.

FIGS. 3A through 3E are schematic cross-sectional views showing a method of manufacturing the organic light-emitting display apparatus 10 of FIG. 1A, according to an embodiment of the present disclosure.

Figure 3A:
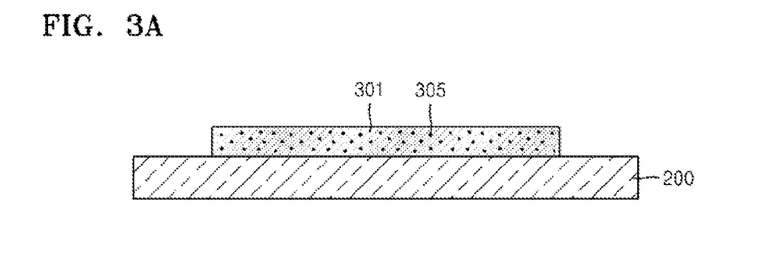
FIGS. 3A through 3E are schematic cross-sectional views showing a method of manufacturing an organic light-emitting display apparatus of FIG. 1A, according to an embodiment of the present invention.

Referring to FIG. 3A, a liquid phase filling material 301 is coated on a surface of the encapsulation substrate 200. The liquid phase filling material 301 may include a black material 305, for example, at least one of a black pigment, a black dye, and black particles. The black material 305 may be mixed in the liquid phase filling material 301 before or after coating the liquid phase filling material 301 on the surface of the encapsulation substrate 200.

In the current embodiment, the liquid phase filling material 301 may be silicon. More specifically, the liquid phase filling material 301 may be methyl silicone, phenyl silicone, or a mixture of these materials. In the current embodiment, the liquid phase filling material 301 may be liquid phase polyimide. Here, the liquid phase polyimide denotes a state that polyimide is dissolved in an organic solvent that performs a diluent and has flowability.

The liquid phase filling material 301 may be coated by a spin coating process, a slit coating process, or a gravure process. Since the liquid phase filling material 301 has flowability, planarity is good after coating it, and thus, product failure due to a step difference may be reduced.

Next, the liquid phase filling material 301 may be softly baked at a low temperature. The soft baking may be a process of reducing flowability by semi-hardening or semi-drying the liquid phase filling material 301 to remove some portion of an organic solvent included in the liquid phase filling material 301.

Figure 3B:
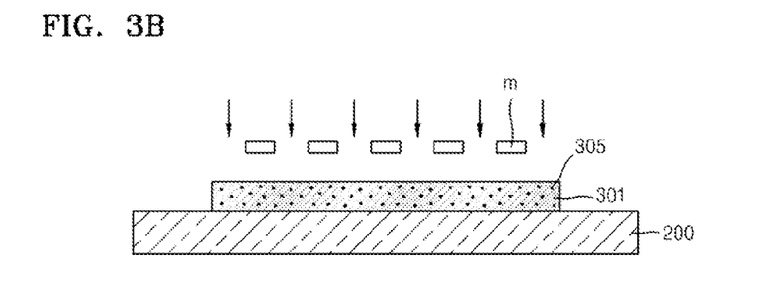
Figure 3C:
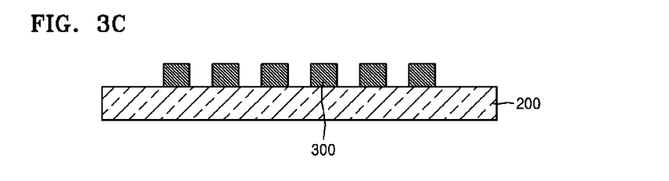

Referring to FIGS. 3B and 3C, the semi-hardened or semi-dried liquid phase filling material 301 is patterned by using a mask m. That is, the liquid phase filling material 301 is exposed to light after aligning the liquid phase filling material 301 with a desired shape of mask to harden and develop the liquid phase filling material 301, and thus, the liquid phase filling material 301 is patterned. Here, the process of patterning according to the current embodiment is not limited to the process described with reference to FIGS. 3B and 3C, that is, the liquid phase filling material 301 in the exposed region may be removed, and the liquid phase filling material 30 in the region that is not exposed may remain. That is, the patterning process is similar to a general photolithography process, and thus, the detailed description will be omitted.

The liquid phase filling material 301 may become a solid phase filling material 300 by the exposing to light. Also, a hardening process may further be included after the patterning. The liquid phase filling material 301 may be hardened to a solid state by an optical hardening method, a thermal hardening method, an acid hardening method, or a combination of these methods according to the material of the liquid phase filling material 301. In the current embodiment, the liquid phase filling material 301 may be hardened by vaporizing the solvent at a high temperature. For example, the hardening temperature may be in a range from about 200° C. to about 300° C.

Figure 3D:
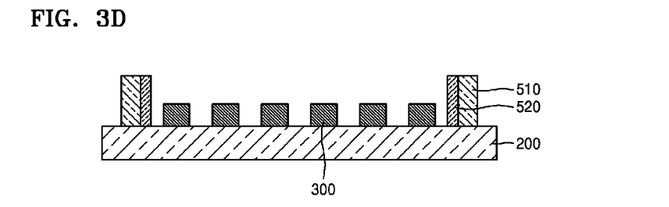

Next, referring to FIG. 3D, the encapsulating member 510 and the moisture absorbent 520 are formed vertically on the encapsulation substrate 200 to surround the solid phase filling material 300. At this point, the encapsulating member 510 may be formed by coating a liquid phase or paste state encapsulating material, and the moisture absorbent 520 may be formed by coating a liquid phase moisture absorbent material.

Figure 3E:
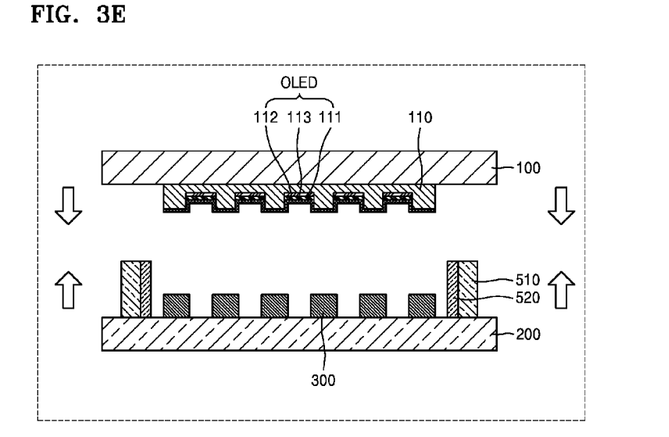

Referring to FIG. 3E, the display substrate 100 on which the display unit 110 including the TFTs, and the OLEDs are formed is combined with the encapsulation substrate 200. At this point, the display substrate 100 and the encapsulation substrate 200 are disposed so that the display unit 110 faces the solid phase filling material 300. In the current embodiment, the display substrate 100 and the encapsulation substrate 200 may be combined in a vacuum state. When the display substrate 100 is combined with the encapsulation substrate 200 in a vacuum state, the penetration of external moisture and foreign materials may be reduced. The display substrate 100 and the encapsulation substrate 200 are bonded by using the encapsulating member 510. In the current embodiment, the combining of the display substrate 100 with the encapsulation substrate 200 may be completed by melting a surface of the encapsulating member 510 that contacts the display substrate 100 and/or the encapsulation substrate 200 by irradiating ultraviolet rays to the encapsulating member 510 that corresponds to the display substrate 100 and/or the encapsulation substrate 200. However, the above method is an exemplary, that is, the display substrate 100 and the encapsulation substrate 200 may be combined in various ways according to the kinds of the encapsulating member 510.

Figure 4:
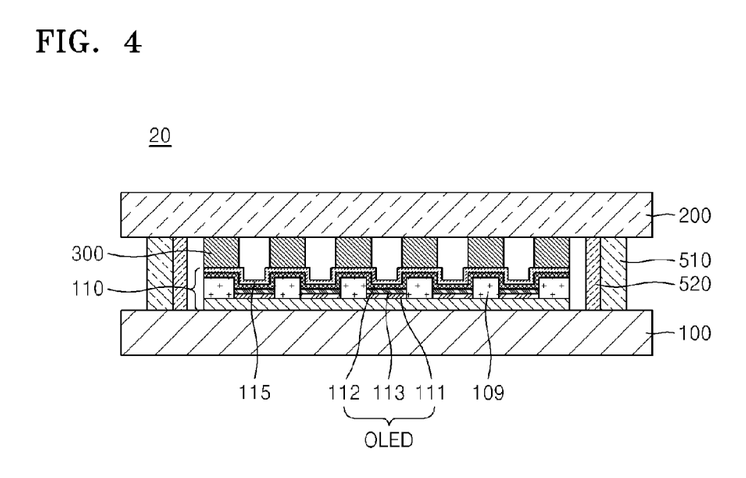
FIG. 4 is a schematic cross-sectional view of an organic light-emitting display apparatus according to another embodiment of the present invention.

FIG. 4 is a schematic cross-sectional view of an organic light-emitting display apparatus 20 according to another embodiment of the present disclosure. In FIG. 4, like reference numerals denote like elements in FIG. 1, and thus, descriptions thereof will be omitted.

Referring to FIG. 4, the organic light-emitting display apparatus 20 further includes a protective layer 115 on the cathode electrode 112 when compared to the organic light-emitting display apparatus 10 of FIG. 1. In FIG. 4, the protective layer 115 covers both the light-emitting regions and the non-light emitting regions, but the present invention is not limited thereto. The protective layer 115 may only cover the light-emitting regions, i.e. the OLEDs. The protective layer 115 may be an inorganic insulating layer and/or an organic insulating layer. The inorganic insulating layer may be formed including a material selected from the group consisting of $SiO_2$, SiNx, SiON, $Al_2O_3$, $TiO_2$, $Ta_2O_5$, $HfO_2$, $ZrO_2$, BST, and PZT. The organic insulating layer may be formed including at least one material selected from the group consisting of poly(methylmethacrylate) (PMMA), polystyrene (PS), a polymer derivative having a phenol group, an acryl group polymer, an imide group polymer, an arylester group polymer, an amide group polymer, a fluoride group polymer, a p-gilyrene group polymer, a vinyl alcohol group polymer, and a blend of these materials. The protective layer 115 may be deposited by using various deposition methods, such as a plasma enhanced chemical vapor deposition (PECVD) method, an atmospheric pressure CVD (APCVD) method, or a low pressure CVD (LPCVD) method.

Figure 5:
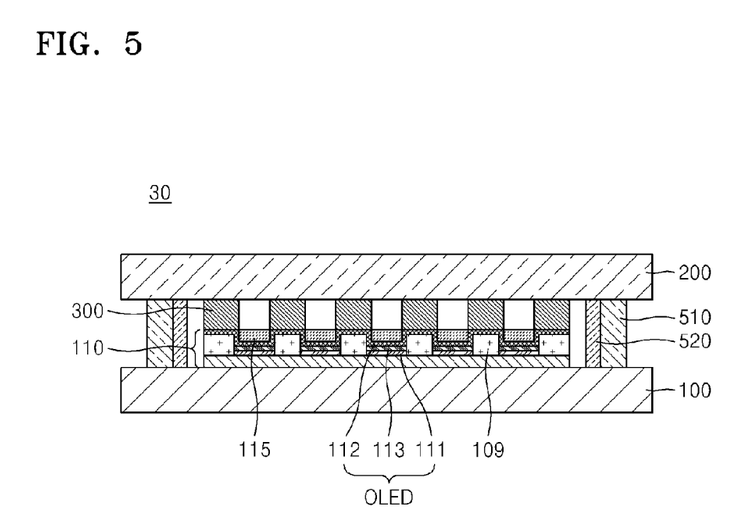
FIG. 5 is a schematic cross-sectional view of an organic light-emitting display apparatus according to another embodiment of the present invention.

FIG. 5 is a schematic cross-sectional view of an organic light-emitting display apparatus 30 according to another embodiment of the present disclosure. In FIG. 5, like reference numerals denote like elements in FIG. 4, and thus, descriptions thereof will be omitted.

Referring to FIG. 5, when the organic light-emitting display apparatus 30 is compared with the organic light-emitting display apparatus 20 of FIG. 4, there is a difference in that the protective layer 115 is formed to cover the light-emitting regions being parallel to a protrusion unit of the non-light-emitting region. The thickness of the protective layer 115 may be variously changed in consideration of optical loss and protection of the OLEDs. Although, it is depicted that the protective layer 115 is formed in the light-emitting region in FIG. 5, the present disclosure is not limited thereto. That is, the protective layer 115 may be formed both in the light-emitting region and the non-light emitting region with planarity.

Figure 6:
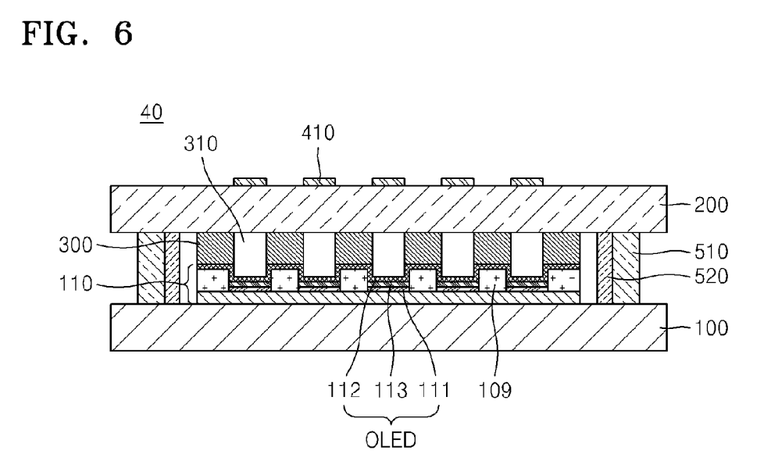
FIG. 6 is a schematic cross-sectional view of an organic light-emitting display apparatus according to still another embodiment of the present invention.

FIG. 6 is a schematic cross-sectional view of an organic light-emitting display apparatus 40 according to still another embodiment of the present disclosure. In FIG. 6, like reference numerals denote like elements in FIG. 1, and thus, descriptions thereof will be omitted.

Referring to FIG. 6, when the organic light-emitting display apparatus 40 is compared with the organic light-emitting display apparatus 10 of FIG. 1, the organic light-emitting display apparatus 40 further includes color filters 410.

The color filters 410 are disposed corresponding to the OLEDs that define the light-emitting regions. The color filters 410 may be formed to realize a full-color image, to increase in color purity, and to increase ambient contrast ratio (ACR). In the drawing, the color filters 410 may be formed on an upper surface of the encapsulation substrate 200, but the present disclosure is not limited thereto. For example, the color filters 410 may be formed on a lower surface of the encapsulation substrate 200 or may be formed in contact with the OLEDs.

The color filters 410 may extract light corresponding to a predetermined color from light emitted from the organic light-emitting layer 113 in the OLED. The color filters 410 may realize various colors according to the OLEDs that correspond to the color filters 410. In the current embodiment, the color filters 410 may realize one of red, green, and blue color. In the current embodiment, the color filters 410 may realize a color of a wavelength band of light emitted from the OLEDs. For example, the color filters 410 that realize blue color may be disposed on the OLEDs that emit blue color. However, the present disclosure is not limited thereto, that is, the color filters 410 may realize various colors.

Figure 7:
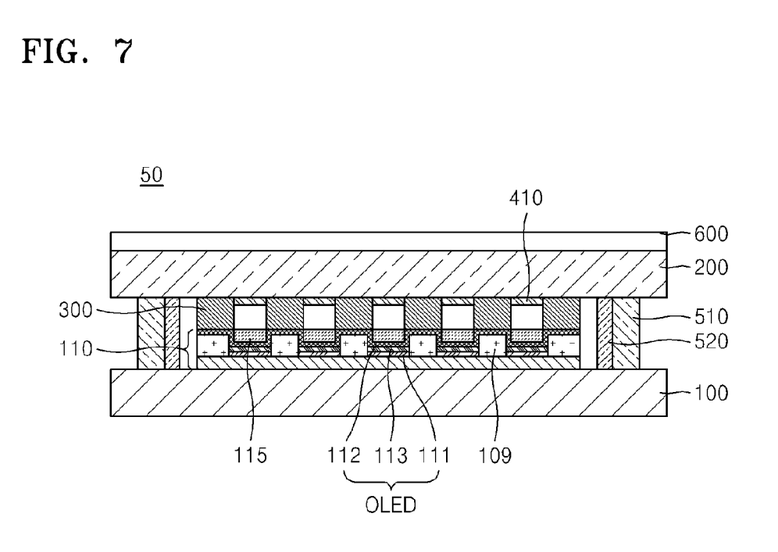
FIG. 7 is a schematic cross-sectional view of an organic light-emitting display apparatus according to yet another embodiment of the present invention.

FIG. 7 is a schematic cross-sectional view of an organic light-emitting display apparatus 50 according to yet another embodiment of the present disclosure. In FIG. 7, like reference numerals denote like elements in FIG. 5, and thus, descriptions thereof will be omitted.

Referring to FIG. 7, when the organic light-emitting display apparatus 50 is compared with the organic light-emitting display apparatus 30 of FIG. 5, the organic light-emitting display apparatus 50 further includes color filters 410 and a polarizing layer 600.

The color filters 410 are disposed corresponding to the OLEDs that define the light-emitting regions. The color filters 410 may be formed to realize a full-color image, to increase in color purity, and to increase ambient contrast ratio (ACR). In the drawing, the color filters 410 are formed on a lower surface of the encapsulation substrate 200, but the present disclosure is not limited thereto. The color filter 410 may be configured to the same as the color filters 410 of FIG. 6.

The polarizing layer 600 is formed to prevent reduction of contrast due to external light by blocking the external light incident from the outside. The polarizing layer 600 may be a circular polarizing plate, a linear polarizing plate, or a combination of these polarizing plates.

In the current embodiment, the OLEDs are formed on the planarizing layer 107. However, the present disclosure is not limited thereto, that is, may be applied to a type in which the OLEDs are formed on the gate insulating layer 103 or the interlayer insulating layer 105, or the auxiliary layer 101.

While the organic light-emitting display apparatuses 10, 20, 30, 40, and 50 according to the present invention have been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. An organic light-emitting display apparatus comprising:
a display substrate;
a plurality of organic light-emitting devices (OLEDs) that are disposed on the display substrate and are separated by a pixel defining layer;
a protective layer disposed on each of the OLEDs;
an encapsulation substrate that is disposed facing the display substrate and covers the OLEDs;
a filling material that is disposed between the display substrate and the encapsulation substrate and disposed corresponding to the pixel defining layer,
an encapsulating member that combines the display substrate with the encapsulation substrate and is disposed to surround the OLEDs, and
a moisture absorbent disposed on a side of the OLEDs,
wherein the filling material includes a material that absorbs visible light, and the filling material protrudes toward the pixel defining layer and surrounds each of the OLEDs and the protective layer on the each of the OLEDs, and
wherein the moisture absorbent is located between the encapsulation member and the filling material.

2. The organic light-emitting display apparatus of claim 1, wherein the filling material comprises at least one of a black pigment, a black dye, and black particles.

3. The organic light-emitting display apparatus of claim 1, wherein the filling material comprises at least one of methyl silicone and phenyl silicone.

4. The organic light-emitting display apparatus of claim 1, wherein the filling material comprises at least one selected from the group consisting of Cr, CrO, Graphite, and C.

5. The organic light-emitting display apparatus of claim 1, further comprising a color filter disposed corresponding to the OLED on the encapsulation substrate.

6. The organic light-emitting display apparatus of claim 1, further comprising cavities that are disposed between the display substrate and the encapsulation substrate and are disposed corresponding to the OLED, wherein the cavities are filled with air or N2 gas.

7. The organic light-emitting display apparatus of claim 1, further comprising a protective layer disposed on the OLEDs.

8. The organic light-emitting display apparatus of claim 1, further comprising a polarizing layer disposed on the encapsulation substrate.

9. The organic light emitting display apparatus of claim 1, wherein the moisture absorbent comprises silica gel or phosphorus pentoxide or a combination thereof.

10. An organic light-emitting display apparatus, comprising:
a display substrate;
a display unit that is formed on the display substrate and comprises a plurality of light-emitting regions on which OLEDs are disposed and non-light-emitting regions that separate the light-emitting regions;
a protective layer disposed on each of the OLEDs;
an encapsulation substrate that is disposed facing the display substrate;
a filling material that is disposed between the display substrate and the encapsulation substrate and is disposed corresponding to the non-light-emitting regions,
an encapsulating member that combines the display substrate with the encapsulation substrate and is disposed to surround the OLEDs, and
a moisture absorbent disposed on a side of the OLEDs,
wherein the filling material performs as a black matrix that absorbs visible light, wherein the filling material protrudes toward the non-light-emitting regions and surrounds each of the light-emitting regions and the protective layer on the each of the OLEDs, and
wherein the moisture absorbent is located between the encapsulation member and the filling material.

11. The organic light-emitting display apparatus of claim 10, wherein the non-light-emitting regions protrude more than the light-emitting regions.

12. The organic light-emitting display apparatus of claim 10, wherein the filling material is not formed on the light-emitting regions.

13. The organic light-emitting display apparatus of claim 10, wherein the filling material is formed of an insulating material that includes a black pigment, a black dye, or black particles.

14. The organic light-emitting display apparatus of claim 10, further comprising a color filter disposed corresponding to the OLEDs on the encapsulation substrate.

15. The organic light-emitting display apparatus of claim 10, further comprising a protective layer on the OLEDs.

16. A method of manufacturing an organic light-emitting display apparatus, the method comprising:
forming a patterned filling material on a surface of an encapsulation substrate;
forming a display unit on a surface of a display substrate comprising OLEDs;
forming a protective layer disposed on each of the OLEDs; and
combining the display substrate with the encapsulation substrate with an encapsulating member by disposing the display substrate and the encapsulation substrate so that the display substrate faces the filling material,
the filling material surrounds the protective layer on each of the OLEDs and is comprised of at least one of a black pigment, a black dye, and black particles;
and further comprising forming a moisture absorbent between the encapsulation member and the filling material before combining the display substrate with the encapsulation substrate.

17. The method of claim 16, wherein the display unit is divided into light-emitting regions on which OLEDs are disposed and non-light-emitting regions that separate the light-emitting regions and the filling material is patterned to be disposed only on regions of the display unit corresponding to the non-light-emitting regions.

18. The method of claim 16, wherein the filling material comprises at least one of methyl silicone and phenyl silicone.

19. The method of claim 16, wherein the filling material comprises at least one selected from the group consisting of Cr, CrO, Graphite, and C.

20. The method of claim 16, wherein the forming of the patterned filling material comprises:
distributing at least one of a black pigment, a black dye, and black particles in a liquid phase filling material;
coating the liquid phase filling material on the encapsulation substrate; and
patterning the filling material through an exposure and developing process.

21. The method of claim 20, further comprising hardening the liquid phase filling material.

22. The method of claim 16, wherein the combining of the display substrate with the encapsulation substrate further comprises:
- coating the encapsulating member to surround edges of the filling material; and
- combining the display substrate with the encapsulation substrate by using the encapsulating member in a vacuum state by disposing the display substrate and the encapsulation substrate so that the display substrate faces the filling material.

23. The method of claim 16, wherein the display unit is divided into light-emitting regions on which OLEDs are disposed and non-light-emitting regions that separate the light-emitting regions, and the method further comprises forming a color filter in regions of the encapsulation substrate that corresponds to the light-emitting regions.

* * * * *